(12) United States Patent
Jensen et al.

(10) Patent No.: US 6,998,922 B2
(45) Date of Patent: Feb. 14, 2006

(54) PHASE LOCKED LOOP MODULATOR CALIBRATION TECHNIQUES

(75) Inventors: Henrik T. Jensen, Long Beach, CA (US); Hea Joung Kim, Los Angeles, CA (US)

(73) Assignee: Broadcom Corp., Irvine, CA (US)

( * ) Notice: Subject to any disclaimer, the term of this patent is extended or adjusted under 35 U.S.C. 154(b) by 67 days.

(21) Appl. No.: 10/657,434

(22) Filed: Sep. 8, 2003

(65) Prior Publication Data
US 2005/0052251 A1    Mar. 10, 2005

(51) Int. Cl.
*H03L 7/08*    (2006.01)
*H03L 7/099*    (2006.01)

(52) U.S. Cl. .......................... 331/17; 331/14; 331/16; 331/18; 331/25

(58) Field of Classification Search ................ 331/1 A, 331/14, 16–18, 23, 25, DIG. 2; 327/156–159; 332/127; 360/51; 375/376; 455/260
See application file for complete search history.

(56) References Cited

U.S. PATENT DOCUMENTS

| | | | | |
|---|---|---|---|---|
| 4,871,979 A | * | 10/1989 | Shearer et al. | 330/253 |
| 5,126,692 A | * | 6/1992 | Shearer et al. | 331/8 |
| 5,687,201 A | * | 11/1997 | McClellan et al. | 375/374 |
| 5,933,037 A | * | 8/1999 | Momtaz | 327/157 |
| 6,049,255 A | * | 4/2000 | Hagberg et al. | 331/17 |
| 6,377,091 B1 | * | 4/2002 | Williams et al. | 327/156 |
| 6,724,265 B2 | * | 4/2004 | Humphreys | 331/17 |

* cited by examiner

*Primary Examiner*—David Mis
(74) *Attorney, Agent, or Firm*—Garlick, Harrison & Markison, LLP; Timothy W. Markison

(57) ABSTRACT

A method for calibrating a phase locked loop begins by determining a gain offset of a voltage controlled oscillator of the phase locked loop. The processing then continues by adjusting current of a charge pump of the phase locked loop based on the gain offset.

20 Claims, 8 Drawing Sheets

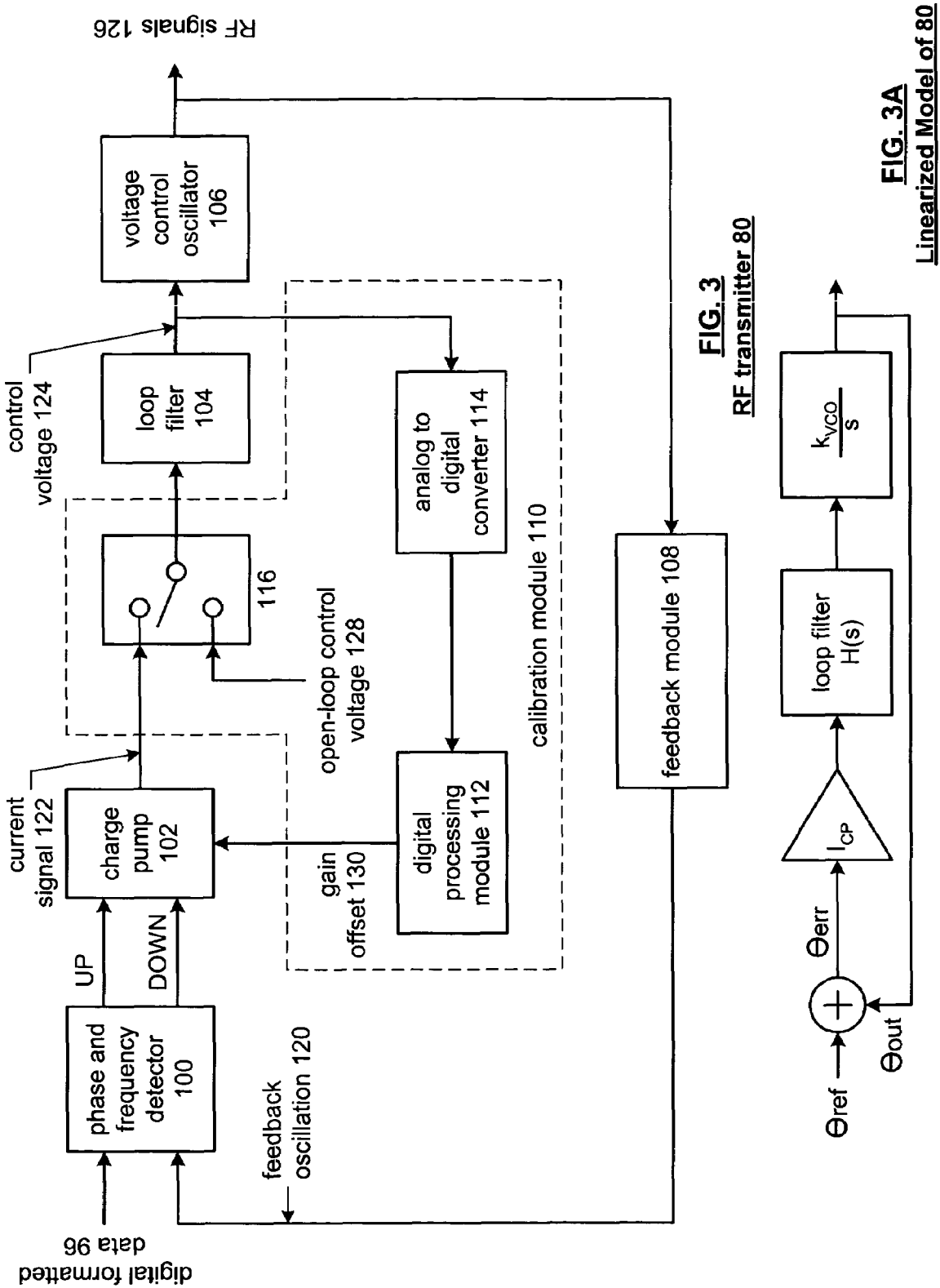

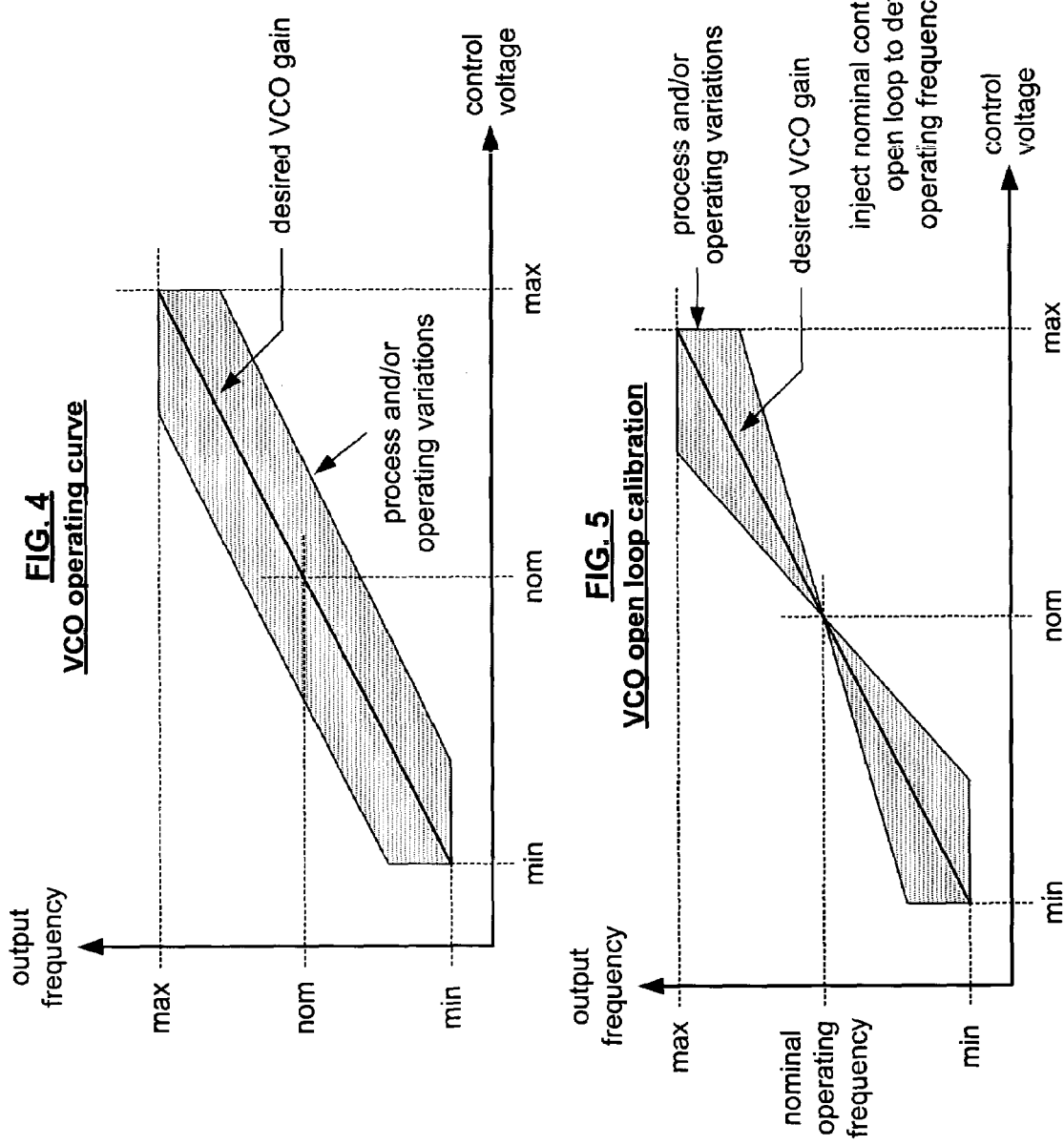

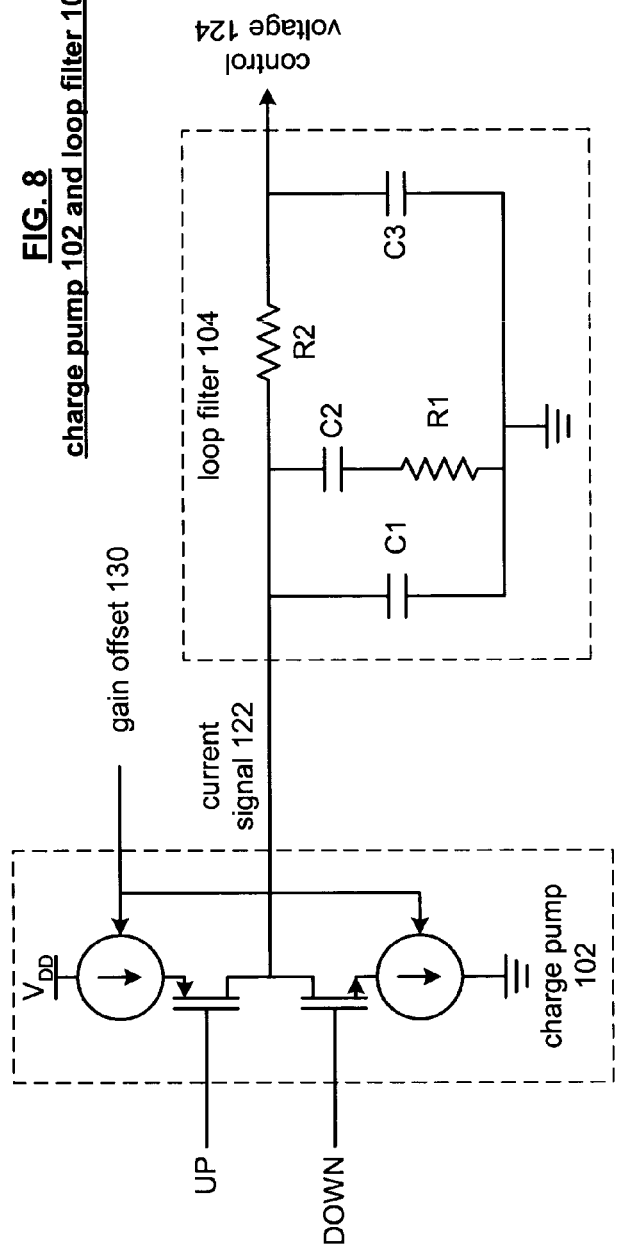
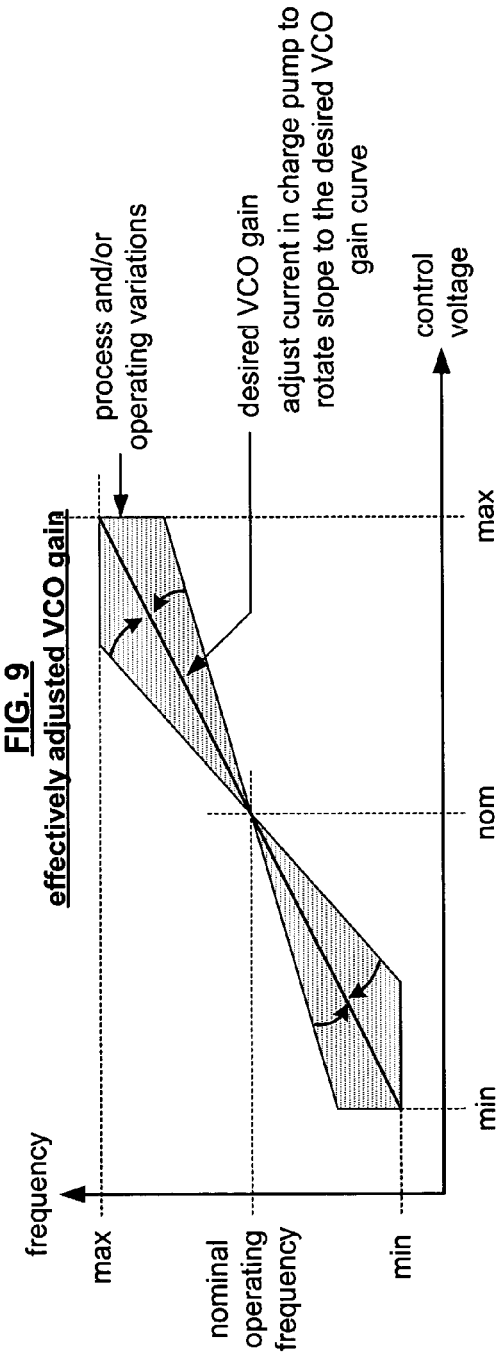

PLL 160

PHASE LOCKED LOOP MODULATOR CALIBRATION TECHNIQUES

BACKGROUND OF THE INVENTION

1. Technical Field

This invention relates generally to communication systems and, more particularly, to radio receivers and transmitters used within such communication systems.

2. Description of Related Art

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel or channels. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals via one or more intermediate frequency stages to produce baseband signals, and demodulates the baseband signals in accordance with a particular wireless communication standard to recapture the transmitted data. The transmitter converts data into RF signals by modulating the data in accordance with the particular wireless communication standard to produce baseband signals and mixes the baseband signals with an RF carrier in one or more intermediate frequency stages to produce RF signals.

As is known, phase locked loops (PLL) are commonly used in integrated wireless transceivers as components for frequency generation and modulation due to their high level of integration and ability to operate over a wide range of frequencies. As is further known, two basic PLL topologies exist, usually referred to as "type 1" and "type 2", respectively. The general structure is common to both types of PLLs, namely a phase detector, a lowpass filter (LPF), a voltage controlled oscillator (VCO) and a feedback path. The phase detector serves as an "error amplifier" in the feedback loop, thereby minimizing the phase difference between the input reference signal and the feedback signal. The loop is considered "locked" if this phase difference is constant with time.

In "type 1" PLLs, the phase detector generates square voltage pulses whose duration is proportional to the phase error. These voltage pulses are filtered by the LPF to generate a smooth VCO control voltage whose amplitude is proportional to the phase error. The VCO responds to the change in control voltage by increasing or decreasing its oscillation frequency. The feedback action of the PLL then causes the VCO to lock to the desired operating frequency.

In "type 2" PLLs, also known as "charge pump based PLLs", the topology includes a phase and frequency detector, a charge pump, a loop filter, a voltage controlled oscillator (VCO), and a feedback path. The phase and frequency detector compares the phase and frequency of a reference signal with the phase and frequency of a feedback signal (e.g., the output oscillation produced by the VCO fed back to the phase and frequency detector via the feedback loop). If the phase and/or frequency of the reference signal leads the phase and/or frequency of the feedback signal (which occurs when the output oscillation is below the desired rate), the phase and frequency detector generates an up signal. In response to the up signal, the charge pump increases the positive current it outputs, which, when filtered by the loop filter, increases the control voltage input of the VCO. With an increase in the control voltage, the VCO increases the rate of the output oscillation. If the phase and/or frequency of the reference signal lags the phase and/or frequency of the feedback signal (which occurs when the output oscillation is above the desired rate), the phase and frequency detector generates a down signal. In response to the down signal, the charge pump increases the negative current it outputs, which, when filtered by the loop filter, decreases the control voltage input of the VCO. With a decrease of the control voltage input, the VCO decreases the rate of the output oscillation.

In an ideal PLL, the VCO operates linearly, which can be mathematically expressed as:

$$\theta_{out}(t) = K_{vco} \int V_{cntl}(t) dt,$$

where $K_{vco}$ is the gain (specified in MHz/volt, for example) of the VCO, $\theta_{out}$ is the output oscillation of the VCO, and $V_{cntl}$ is in the input control voltage of the VCO. Based on this ideal model, when the PLL settles to a desired output frequency (i.e., the output of the VCO), the input control voltage of the VCO assumes a constant value. When used as a modulator, the control voltage varies around this constant value according to the desired modulation pattern, thereby generating frequency modulation. It follows directly from the above equation that the modulated signal is proportional to the change in control voltage with a proportionality constant equal to Kvco In practice, however, the gain of the VCO (i.e., Kvco) is not a constant, but varies with integrated circuit fabrication process, PLL frequency band, control voltage amplitude, and temperature. For instance, for a PLL that has a wide frequency range of operation, the gain of the VCO may vary from its nominal design value by as much as +/−50%. Since Kvco is a key parameter governing the dynamic behavior of the PLL, when used as a modulator (e.g., in a translational loop), the large variation of VCO gain may produce prohibitively large modulation errors.

One solution to reduce the adverse affects of the variations of the VCO gain is to design the baseband processor to account for the VCO gain variations. This solution, however, relies on an assumed VCO gain variation, not an actual variation, and may therefore not be precise As such, this solution is of limited benefit.

Therefore, a need exists for a method and apparatus to determine the actual VCO gain variations and to calibrate the PLL dynamics based on the actual VCO gain variations.

BRIEF SUMMARY OF THE INVENTION

The calibration of a phase locked loop of the present invention substantially meets these needs and others. In one embodiment, a method for calibrating a phase locked loop begins by determining a gain offset of a voltage controlled oscillator of the phase locked loop. The processing then continues by adjusting current of a charge pump of the phase locked loop based on the gain offset. The gain offset may be determined by first measuring a control voltage of the voltage controlled oscillator when a reference oscillation is inputted to the phase locked loop to produce a first measured control voltage. The determination of the gain offset continues by injecting a frequency offset into the phase locked loop and measuring the control voltage of the voltage controlled oscillator to produce a second measured controlled voltage. The determination of the gain offset continues by determining the gain offset based on the frequency offset, the first measured control voltage and the second measured control voltage. With such a method and apparatus performing the method, the actual VCO gain variations are determined and the PLL (or translational loop) is adjusted based on the actual VCO gain variations.

In another embodiment, a method for calibrating the dynamics of a phase locked loop, begins by determining a gain offset of a voltage controlled oscillator of the phase locked loop. The processing then continues by adjusting programmable components inside the voltage controlled oscillator based on the gain offset. These programmable components affect the gain of the voltage controlled oscillator such that nearly nominal behavior is achieved. The gain offset may be determined analogously to the technique described above.

In another embodiment, an auto-calibrating phase locked loop includes a phase and frequency detection module, a charge pump circuit, a loop filter, a voltage controlled oscillator, and a calibration module. The phase and frequency detection module is operably coupled to produce an up signal when at least one of phase and frequency of a reference oscillation leads at least one of phase and frequency of a feedback oscillation and to produce a down signal when the at least one of phase and frequency of the feedback oscillation leads the at least one of phase and frequency of the reference oscillation. The charge pump circuit is operably coupled to convert the up signal and down signal into a current signal. The loop filter is operably coupled to convert the current signal into a control voltage. The voltage controlled oscillator is operably coupled to convert the control voltage into an output oscillation, wherein the feedback oscillation is derived from the output oscillation. The calibration module is operably coupled to determine a gain offset of a voltage controlled oscillator and to adjust at least one dependent current source of the charge pump based on the gain offset.

BRIEF DESCRIPTION OF THE SEVERAL VIEWS OF THE DRAWINGS

FIG. 3 is a schematic block diagram of a radio frequency translational loop transmitter in accordance with the present invention;

FIG. 3A is a linearized model of the RF translational loop transmitter of FIG. 3;

FIG. 4 is a graph depicting the variations of the gain of a VCO;

FIG. 5 is a graph depicting an open-loop VCO calibration in accordance with the present invention;

FIG. 8 is a schematic block diagram of a charge pump and loop filter of a PLL in accordance with the present invention;

FIG. 9 is a graph depicting the calibration of the VCO gain in accordance with the present invention;

DETAILED DESCRIPTION OF THE INVENTION

Figure 1:
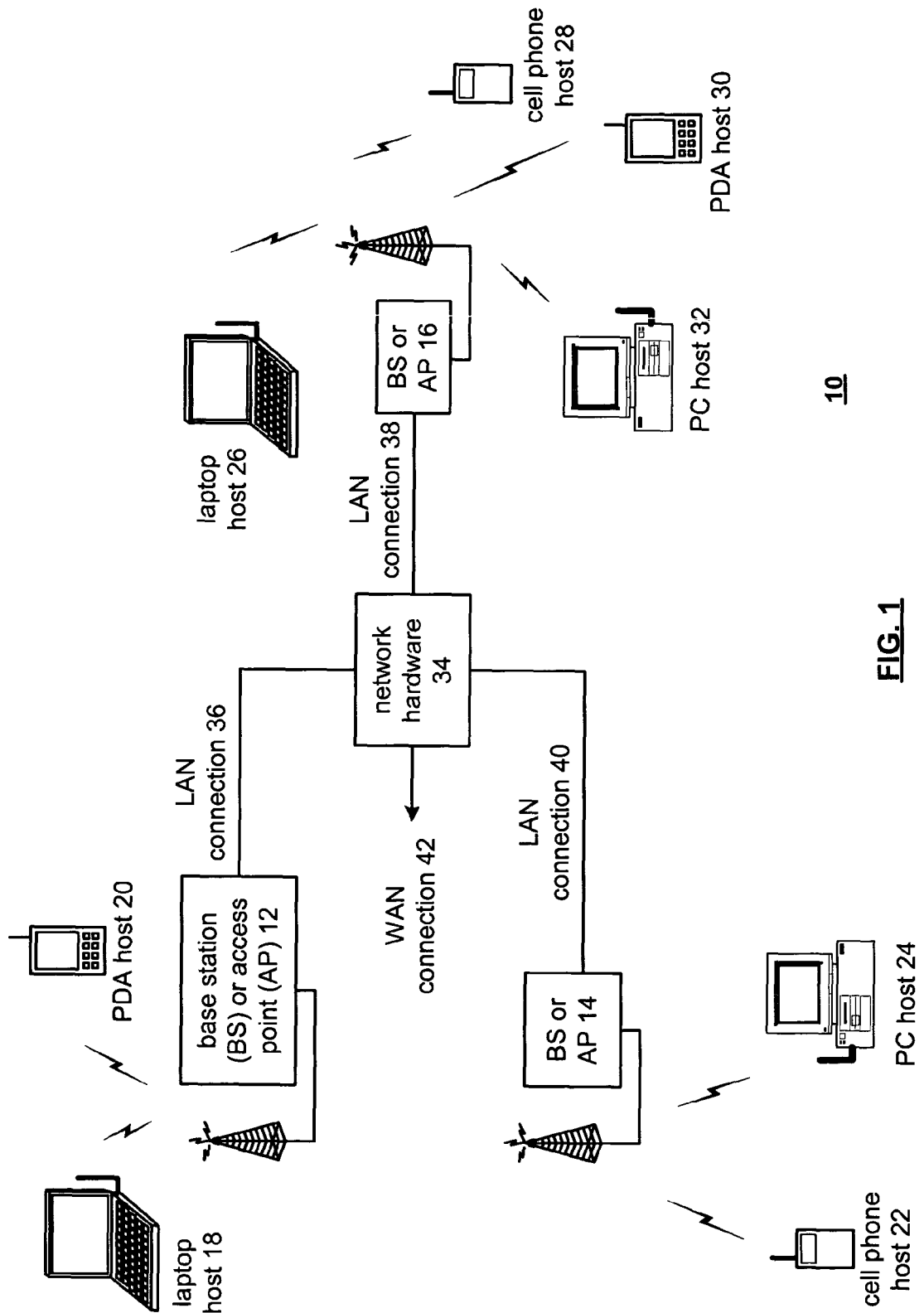
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
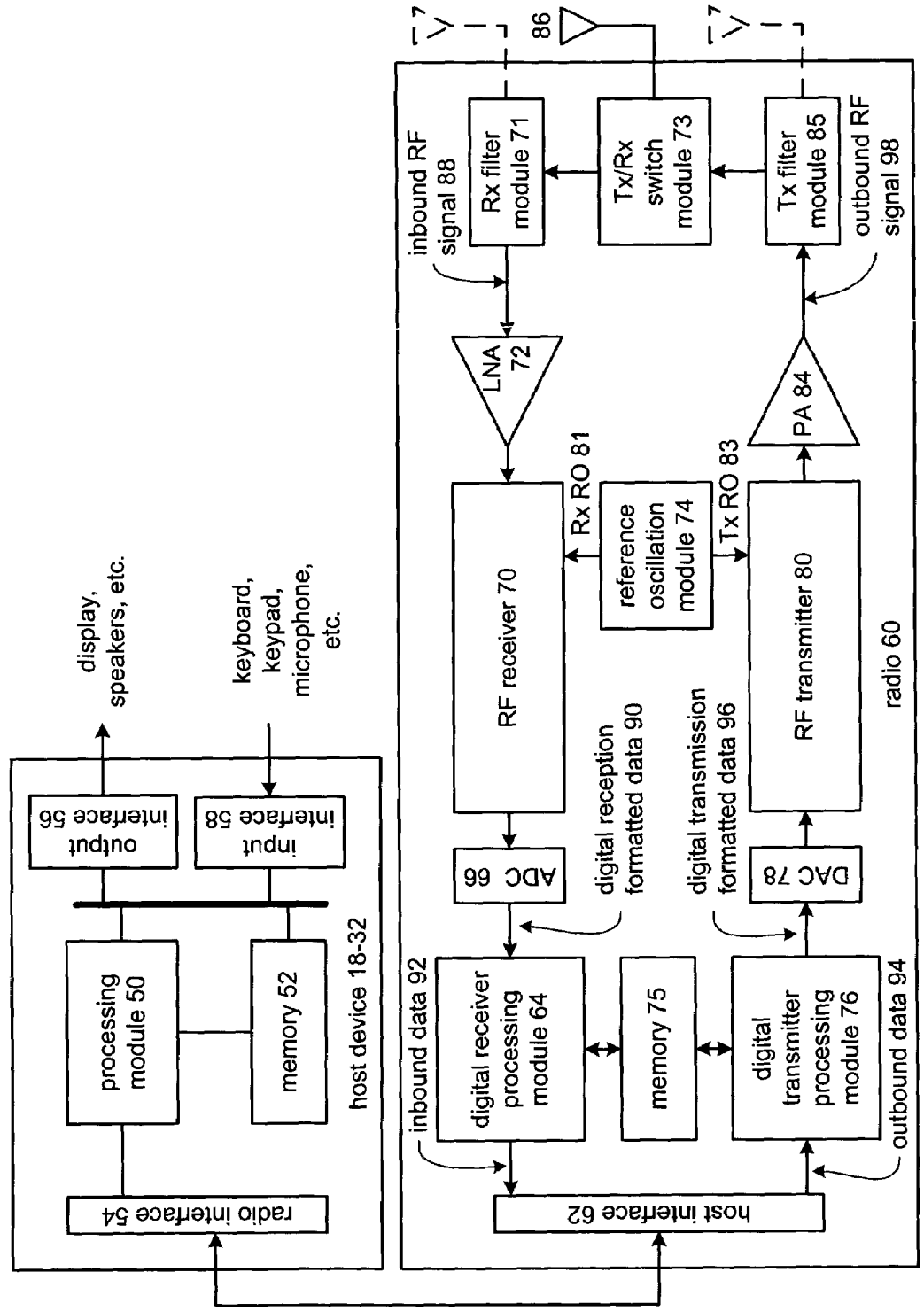
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, an RF receiver section 70 that includes a filtering/gain module and an IF mixing down conversion stage, a receiver filter 71, a low noise amplifier 72, a transmitter/receiver switch 73, a local oscillation module 74, memory 75, a digital transmitter processing module 76, a digital-to-analog converter 78, a transmitter section 80 that includes a filtering/gain module and an IF mixing up conversion stage, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

Figure 11:
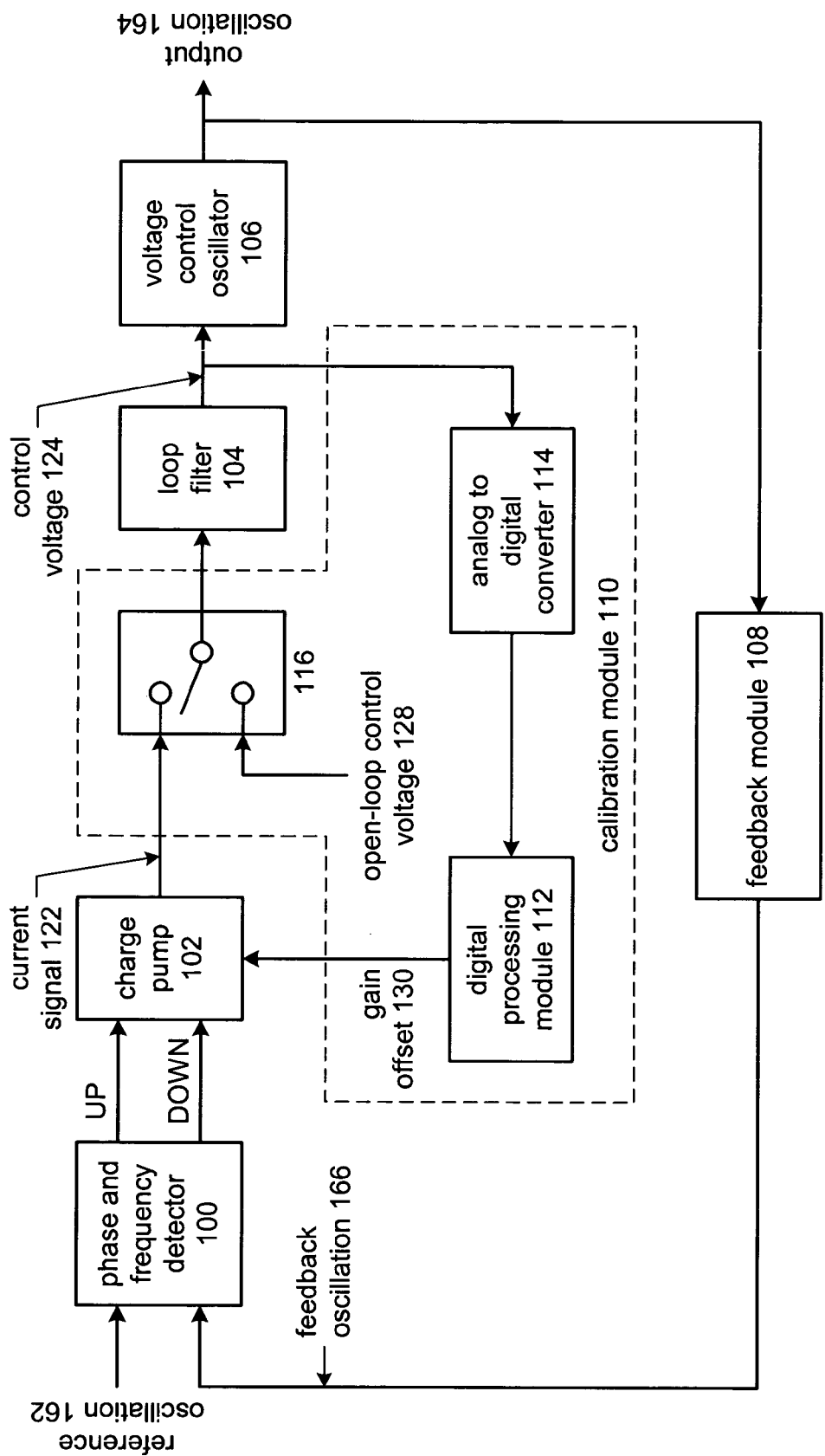
FIG. 11 is a schematic block diagram of a PLL in accordance with the present invention.

The digital-to-analog converter 78 converts the digital transmission formatted data 96 from the digital domain to the analog domain. The filtering/gain module of the transmitter section 80 filters and/or adjusts the gain of the analog signal prior to providing it to the IF mixing stage of the transmitter section 80. The IF mixing stage converts the analog baseband or low IF signal into an RF signal based on a transmitter local oscillation 83 provided by local oscillation module 74, which may include a phase locked loop as shown in FIG. 11. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module of the receiver section 70, which directly converts the amplified inbound RF signal into an inbound low IF signal or baseband signal based on a receiver local oscillation 81 provided by local oscillation module 74, which may include a phase locked loop as shown in FIG. 11. The down conversion module of the receiver section 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

FIG. 3 is a schematic block diagram of the analog portion of the transmitter section 80. In this embodiment, the transmitter 80 is implemented as a translational loop for modulating FSK (frequency shift keying), PSK (phase shift keying), and/or MSK (magnitude shift keying) data 96 into RF signals 126 that are subsequently amplified via the power amplifier 84 and transmitted via the antenna 86. The particular type of data modulation (e.g., FSK, PSK, MSK) and the frequency of the RF signals (e.g., 900 MHz, 1.8 GHz, 2.4 GHz, etc.) are dictated by the particular standard to which the radio conforms. For example, the standard may be GSM, Bluetooth, etc.

The translational loop includes a phase and frequency detector 100, a charge pump 102, a loop filter 104, a voltage controlled oscillator 106, a feedback module 108, and a calibration module 110. The calibration module 110 includes a digital processing module 112, an analog to digital converter (ADC) 114, and a switch mechanism 116. In general, when the gain of the VCO 106 ($k_{VCO}$) changes, it affects the overall loop performance as can be readily seen in the linearized model of FIG. 3A. By introducing an approximately equal but opposite change into the loop, the error caused by the VCO gain change can substantially corrected. As can be inferred from the linearized model of FIG. 3A, the correcting change may be added anywhere in the loop. As will be subsequently described, the correcting change can be added in the charge pump 102.

Returning to the discussion of FIG. 3, in normal operation (i.e., not in calibration mode), the phase and frequency detector 100 compares the phase and/or frequency differences of the digital modulated data 96 and a feedback oscillation 120. Based on these differences, the phase and frequency detector 100 generates an up signal and/or a down signal. The up signal causes the charge pump 102 to source a larger amount of current to the loop filter 104 and the down signal causes the charge pump 102 to sink more current from the loop filter 104. As such, the current signal 122 produced by the charge pump 102 either sources current to or sinks current from the loop filter 104 via the switch 116. The loop filter 104 converts the current signal 122 into a control voltage 124. The VCO 106 converts the control voltage 124 into RF signals 126 based on the gain of the VCO (Kvco). The feedback module 108 produces the feedback oscillation 120 by dividing the rate of the RF signals 126 by a divider value, which may be an integer or a whole number.

To reduce the distortion caused by the variations of the VCO gain, the calibration module 110 calibrates the translational loop for each transmission of a packet of data or as often as needed. To calibrate the loop, the calibration module 110 opens the loop and injects an open-loop voltage 128 into the loop filter 104. The open-loop voltage 128 is a nominal voltage for a nominal VCO gain of VCO 106. With reference to FIG. 4, the gain of the VCO is represented by the curve of output frequency versus the control voltage. The nominal VCO gain is shown as the solid line, which corresponds to producing a nominal output frequency at a nominal control voltage, while the actual gain may vary significantly as illustrated by the shaded area. In the ideal, the nominal control voltage is half way between the minimum control voltage and the maximum control voltage and such a nominal control voltage produces a nominal output frequency, which is half way between the minimum output frequency and the maximum output frequency. Further, in the ideal, from minimum control voltage to maximum control voltage, the output frequency increases linearly from the minimum output frequency to the maximum output frequency. Accordingly, the open-loop voltage 128 is selected to correspond to the ideal nominal voltage even though the actual nominal voltage (i.e., the control voltage producing the nominal output frequency) may vary significantly from the ideal nominal control voltage.

Returning to the discussion of FIG. 3, with the nominal control voltage applied to the input of the VCO 106 via the loop filter 104, the gain of the VCO 106 is measured via the ADC 114 and the digital processing module 112. This is illustrated in FIG. 5, which depicts, for a given VCO, the nominal operating frequency for the nominal control voltage. From this information, the loop may be adjusted to adjust the actual nominal output frequency to substantially equal the ideal nominal output frequency. Such an adjustment may be done by offsetting the control voltage provided by the loop filter 104, by adjusting the current sourced and/or sinked by the charge pump, or by adjusting the up and down signals. Alternatively, the actual nominal output frequency may not be adjusted and used as a reference point for closed loop calibration.

Figure 6:
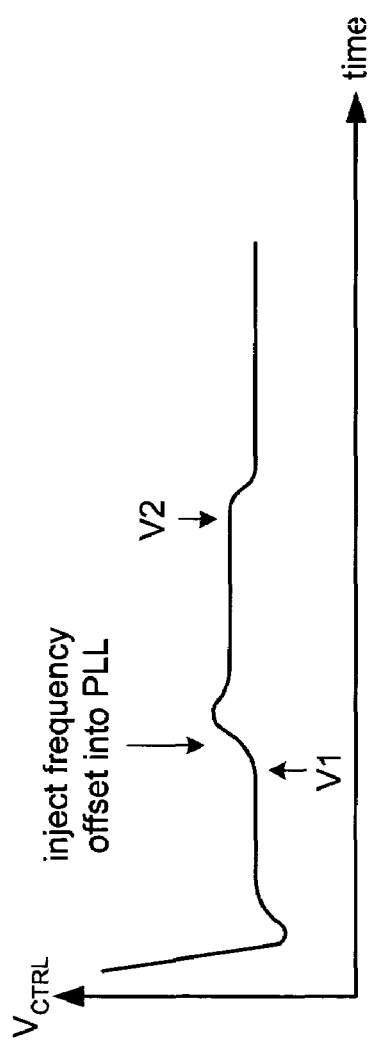
FIG. 6 is a graph depicting an injection of a frequency offset in the PLL to calibrate the PLL in accordance with the present invention.
Figure 7:
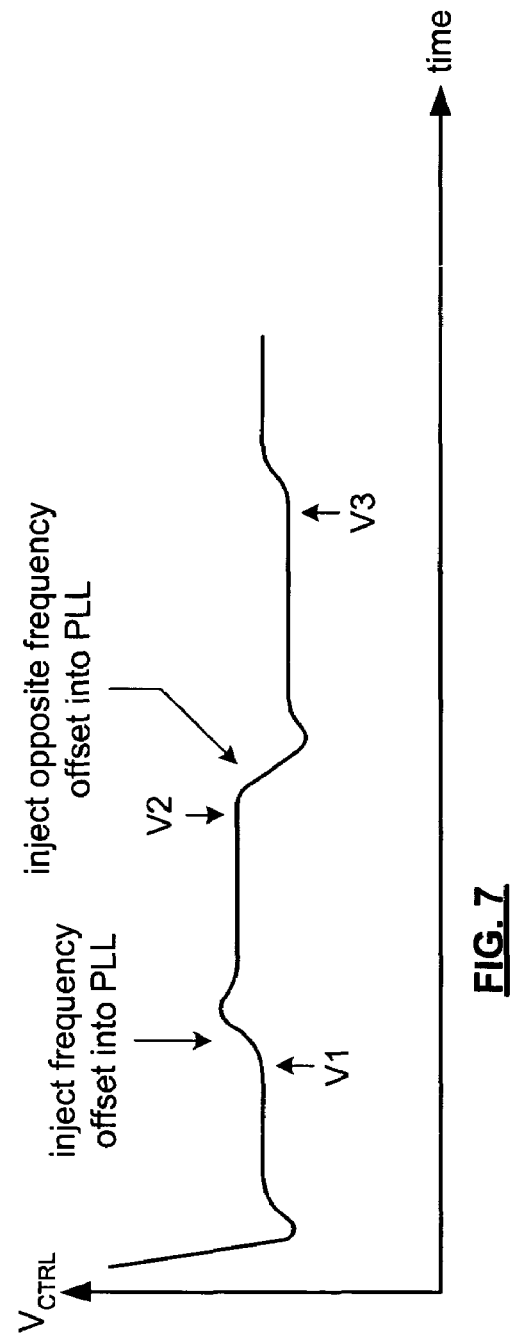
FIG. 7 is a graph depicting an injection of multiple frequency offsets in the PLL to calibrate the PLL in accordance with the present invention.

With the loop closed (i.e., the switch 116 couples the charge pump 102 to the loop filter 104), a frequency offset is injected into the loop. This can be done by injecting a frequency step in the feedback loop or a phase ramp in the feed-forward path. FIG. 6 illustrates the effects on the control voltage with an injection of the frequency offset into the loop. As shown, V1 corresponds to the open-loop control voltage and V2 represents the control voltage after the injection of the frequency offset and the settling of the loop. By injecting a known frequency offset and measuring the new control voltage V2, two points on the curve of the VCO gain is obtained (e.g., the first point corresponds to the open loop test and the second point corresponds to the frequency offset and resulting control voltage). From these two points, the actual gain of the VCO is readily obtained by the equation: Kvco=$\Delta f/(V2-V1)$' where $\Delta f$ represents the frequency offset. By knowing the actual gain, it can be adjusted to more closely match the desired VCO gain. FIG. 7 illustrates the effects on the control voltage when two frequency offsets are injected into the loop. V1 and V2 correspond to the same points in FIG. 6. V3 is the control voltage after the loop has settled with the injection of a negative frequency offset. From these three points, an average actual VCO gain may be obtained.

As shown in FIG. 9, the actual VCO gain is somewhere in the shaded area. By adjusting the current sourced and/or sinked by the charge pump, as will be described with reference to FIG. 8, the VCO gain, on a transmission by transmission basis, is adjusted to the desired VOC gain curve such that the distortion caused by variations of the VCO gain are substantially eliminated.

Returning to the discussion of the FIG. 3, having determined the actual VCO gain, the digital processing module 112 generates a gain offset 130 that adjusts the current sourced and/or sinked by the charge pump 102 to achieve the desired VCO gain as shown in FIG. 9. With the current pump 102 adjusted, the function of the loop is a basic PLL function, where the VCO 106 converts the control voltage 124 into the RF signals 128 and the control voltage 124 is maintained at the desired level via the feedback module 108, the phase and frequency detector 100, and the adjusted charge pump 102.

FIG. 8 is a schematic block diagram of the charge pump 102 and the loop filter 104. The charge pump 102 includes enabling transistors and two dependent current sources. The loop filter 104 includes three capacitors C1–C3 and two resistors R1 and R2. In operation, the upper current source sources a current to the loop filter 104 when the up signal is low and the low current source sinks a current from the loop filter 104 when the down signal is high. The amount of current sourced and/or sinked by the dependent current sources is established by the gain offset signal 130, which may individually set the current levels of the current sources or collectively set the level of the current sources.

The loop filter 104, via the capacitors C1 and C3, store a charge based on the current signal 122 to produce the control voltage 124. Thus, the current signal 122 directly corresponds to the control voltage. Accordingly, by controlling the current sourced and sinked by the charge pump 102, the control voltage is controlled, which adjusts the gain of the VCO. For example, if the gain of the VCO needs to be increased, i.e., increase the slope of the VCO gain curve, the current sourced and sinked by the charge pump is increased. Alternatively, if the gain of the VCO needs to be decreased, the current sourced and sinked by the charge pump is decreased.

Figure 10:
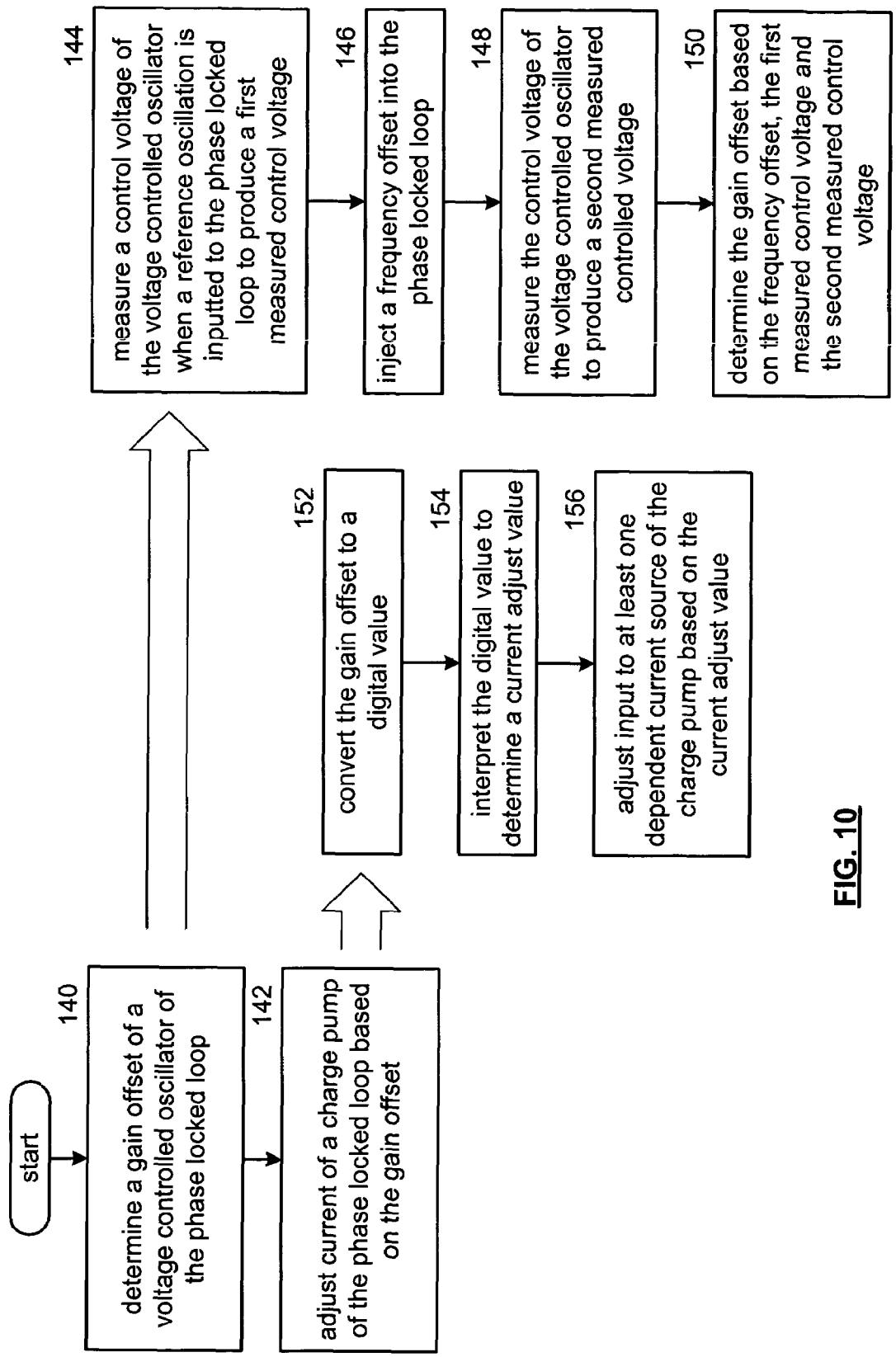
FIG. 10 is a logic diagram of a method for calibrating a PLL in accordance with the present invention.

FIG. 10 is a logic diagram of method for calibrating a phase locked loop. The process begins at step 140, where a gain offset of a voltage controlled oscillator of the phase locked loop is determined. This may be done as shown in steps 144 through 150, which will be discussed below. The process then proceeds to step 142 where the current of a charge pump of the phase locked loop is adjusted based on the gain offset. This may be done as illustrated in steps 152–156, which will be described below. Note that prior to step 140, or as part thereof, an open loop calibration of the voltage controlled oscillator may be performed.

At step 144 a control voltage of the voltage controlled oscillator is measured when a reference oscillation is inputted to the phase locked loop to produce a first measured control voltage. The processing then proceeds to step 146 where a frequency offset is injected into the phase locked loop. The processing continues at step 148 where the control voltage of the voltage controlled oscillator is measured to produce a second measured controlled voltage. The processing continues at step 150 where the gain offset is determined based on the frequency offset, the first measured control voltage and the second measured control voltage. The processing steps 144–150 may be expanding by waiting for expiration of a settling period after injecting the frequency offset before measuring the control voltage. The processing steps of 114–150 may be further expanding by: injecting a second frequency offset into the phase locked loop; measuring the control voltage of the voltage controlled oscillator to produce a third measured controlled voltage, which may be done after the expiration of a settling period; and determining the gain offset based on the frequency offset, the second frequency offset, the first measured control voltage, the second measured control voltage, and the third measured control voltage.

At step 152 the adjusting of the current begins by converting the gain offset to a digital value. The processing continues at step 154 where the digital value is interpreted to determine a current adjust value. The processing then continues at step 156 where the input to at least one dependent current source of the charge pump is adjusted based on the current adjust value.

FIG. 11 illustrates a schematic block diagram of a phase locked loop 160 that includes a phase and frequency detector 100, a charge pump 102, a loop filter 104, a voltage controlled oscillator 106, a feedback module 108, and a calibration module 110. The calibration module 110 includes a digital processing module 112, an analog to digital converter (ADC) 114, and a switch mechanism 116. The phase and frequency detector 100 is operably coupled to compare the phase and frequency differences of a reference oscillation 162 with a feedback oscillation 166, which is a divided representation of the output oscillation 164. Based on the comparison, the phase and frequency detector 100 produces an up signal and/or a down signal.

The charge pump 102, which may be adjusted based on the gain offset signal 130, produces a current signal 122 based on the up and down signals. The loop filter 104 converts the current signal 122 into a control voltage 124, which is provided to the VCO 106. The VCO generates the output oscillation 164 based on the control voltage. The gain of the VCO may be effectively adjusted as previously described with reference to FIG. 3–10.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for reducing distortion of a PLL that is caused by variations of the VCO gain. By obtaining an actual measurement of the VCO gain, an accurate gain adjust value may be achieved. As one of average skill in the art will appreciate, other embodiments may be derived from the teachings of the present invention without deviating from the scope of the claims.

What is claimed is:

1. A method for calibrating a phase locked loop, the method comprises:
   performing an open loop calibration of a voltage controlled oscillator to produce an open loop calibrated voltage controlled oscillator;
   determining a gain offset of the open loop calibrated voltage controlled oscillator of the phase locked loop; and
   adjusting current of a charge pump of the phase locked loop based on the gain offset.

2. The method of claim 1, wherein the determining the gain offset further comprises:
   measuring a control voltage of the voltage controlled oscillator when a reference oscillation is inputted to the phase locked loop to produce a first measured control voltage;
   injecting a frequency offset into the phase locked loop;
   measuring the control voltage of the voltage controlled oscillator to produce a second measured controlled voltage; and
   determining the gain offset based on the frequency offset, the first measured control voltage and the second measured control voltage.

3. The method of claim 2 further comprises:
   waiting for expiration of a settling period after injecting the frequency offset before measuring the control voltage.

4. The method of claim 2 further comprises:
   injecting a second frequency offset into the phase locked loop;
   measuring the control voltage of the voltage controlled oscillator to produce a third measured controlled voltage; and
   determining the gain offset based on the frequency offset, the second frequency offset, the first measured control voltage, the second measured control voltage, and the third measured control voltage.

5. The method of claim 4 further comprises:
   waiting for expiration of a settling period after injecting the second frequency offset before measuring the control voltage.

6. The method of claim 1, wherein the adjusting current of a charge pump further comprises:
   converting the gain offset to a digital value;
   interpreting the digital value to determine a current adjust value; and
   adjusting input to at least one dependent current source of the charge pump based on the current adjust value.

7. An auto-calibrating phase locked loop comprises:
   phase and frequency detection module operably coupled to produce an up signal when at least one of phase and frequency of a reference oscillation leads at least one of phase and frequency of a feedback oscillation and to produce a down signal when the at least one of phase and frequency of the feedback oscillation leads the at least one of phase and frequency of the reference oscillation;
   charge pump circuit operably coupled to convert the up signal and down signal into a current signal;
   loop filter operably coupled to convert the current signal into a control voltage;
   voltage controlled oscillator operably coupled to convert the control voltage into an output oscillation, wherein the feedback oscillation is derived from the output oscillation; and
   calibration module operably coupled to:
      perform an open loop calibration of the voltage controlled oscillator to produce an open loop calibrated voltage controlled oscillator;
      determine a gain offset of the open loop calibrated voltage controlled oscillator; and
      adjust at least one dependent current source of the charge pump based on the gain offset.

8. The auto-calibrating phase locked loop of claim 7, wherein the calibration module further functions to determine the gain offset by:
   measuring a control voltage of the voltage controlled oscillator when a reference oscillation is inputted to the phase locked loop to produce a first measured control voltage;
   injecting a frequency offset into the phase locked loop;
   measuring the control voltage of the voltage controlled oscillator to produce a second measured controlled voltage; and
   determining the gain offset based on the frequency offset, the first measured control voltage and the second measured control voltage.

9. The auto-calibrating phase locked loop of claim 8, wherein the calibration module further functions to:
   wait for expiration of a settling period after injecting the frequency offset before measuring the control voltage.

10. The auto-calibrating phase locked loop of claim 8, wherein the calibration module further functions to:
    inject a second frequency offset into the phase locked loop;
    measure the control voltage of the voltage controlled oscillator to produce a third measured controlled voltage; and
    determine the gain offset based on the frequency offset, the second frequency offset, the first measured control voltage, the second measured control voltage, and the third measured control voltage.

11. The auto-calibrating phase locked loop of claim 10, wherein the calibration module further functions to:
    wait for expiration of a settling period after injecting the second frequency offset before measuring the control voltage.

12. The auto-calibrating phase locked loop of claim 7, wherein the calibration module further functions to adjust the at least one dependent current source by:
    converting the gain offset to a digital value;
    interpreting the digital value to determine a current adjust value; and
    adjusting input to at least one of the at least one dependent current source based on the current adjust value.

13. The auto-calibrating phase locked loop of claim 7, wherein the reference oscillation further comprises at least one of:
    a frequency shift keying modulated signal;
    a phase shift keying modulated signal; and
    a M shift keying modulated signal.

14. A radio transmitter comprises:
    phase and frequency detection module operably coupled to produce an up signal when at least one of phase and frequency of an input modulated signal leads at least one of phase and frequency of a feedback oscillation and to produce a down signal when the at least one of phase and frequency of the feedback oscillation leads the at least one of phase and frequency of the input modulated signal;
    charge pump circuit operably coupled to convert the up signal and down signal into a current signal;

loop filter operably coupled to convert the current signal into a control voltage;

voltage controlled oscillator operably coupled to convert the control voltage into a radio frequency oscillation, wherein the feedback oscillation is derived from the radio frequency oscillation; and calibration module operably coupled to:
- perform an open loop calibration of the voltage controlled oscillator to produce an open loop calibrated voltage controlled oscillator;
- determine a gain offset of the open loop calibrated voltage controlled oscillator; and
- adjust at least one dependent current source of the charge pump based on the gain offset.

15. The radio transmitter of claim 14, wherein the calibration module further functions to determine the gain offset by:
- measuring a control voltage of the voltage controlled oscillator when a reference oscillation is inputted to the phase locked loop to produce a first measured control voltage;
- injecting a frequency offset into the phase locked loop;
- measuring the control voltage of the voltage controlled oscillator to produce a second measured controlled voltage; and
- determining the gain offset based on the frequency offset, the first measured control voltage and the second measured control voltage.

16. The radio transmitter of claim 15, wherein the calibration module further functions to:
- wait for expiration of a settling period after injecting the frequency offset before measuring the control voltage.

17. The radio transmitter of claim 15, wherein the calibration module further functions to:
- inject a second frequency offset into the phase locked loop;
- measure the control voltage of the voltage controlled oscillator to produce a third measured controlled voltage; and
- determine the gain offset based on the frequency offset, the second frequency offset, the first measured control voltage, the second measured control voltage, and the third measured control voltage.

18. The radio transmitter of claim 17, wherein the calibration module further functions to:
- wait for expiration of a settling period after injecting the second frequency offset before measuring the control voltage.

19. The radio transmitter of claim 14, wherein the calibration module further functions to adjust the at least one dependent current source by:
- converting the gain offset to a digital value;
- interpreting the digital value to determine a current adjust value; and
- adjusting input to at least one of the at least one dependent current source based on the current adjust value.

20. The radio transmitter of claim 14, wherein the input modulated signal further comprises at least one of:
- a frequency shift keying modulated signal;
- a phase shift keying modulated signal; and
- a M shift keying modulated signal.

* * * * *